United States Patent
Lin et al.

(10) Patent No.: US 11,264,467 B2
(45) Date of Patent: *Mar. 1, 2022

(54) SEMICONDUCTOR DEVICE HAVING MULTI-LAYER DIFFUSION BARRIER AND METHOD OF MAKING THE SAME

(71) Applicant: Taiwan Semiconductor Manufacturing Co., Ltd., Hsin-Chu (TW)

(72) Inventors: Jyh-nan Lin, Hsinchu (TW); Ding-I Liu, Hsinchu (TW); Yuh-Ta Fan, Shin Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/985,276

(22) Filed: Aug. 5, 2020

(65) Prior Publication Data

US 2020/0365695 A1 Nov. 19, 2020

Related U.S. Application Data

(63) Continuation of application No. 16/009,925, filed on Jun. 15, 2018, now Pat. No. 10,749,004.
(Continued)

(51) Int. Cl.
*H01L 29/12* (2006.01)
*H01L 21/00* (2006.01)
*H01L 29/26* (2006.01)
*H01L 21/02* (2006.01)
*H01L 21/768* (2006.01)
*H01L 23/532* (2006.01)

(52) U.S. Cl.
CPC ........ *H01L 29/26* (2013.01); *H01L 21/02172* (2013.01); *H01L 21/02436* (2013.01); *H01L 21/7685* (2013.01); *H01L 21/76826* (2013.01); *H01L 21/76832* (2013.01); *H01L 21/76834* (2013.01); *H01L 21/76855* (2013.01); *H01L 23/53295* (2013.01)

(58) Field of Classification Search
CPC ......... H01L 21/02436; H01L 21/76834; H01L 21/76855; H01L 29/26; H01L 21/76826; H01L 21/02172; H01L 21/76832; H01L 21/7685; H01L 23/53295
See application file for complete search history.

(56) References Cited

U.S. PATENT DOCUMENTS 6,773,930 B2  8/2004  Summerfelt
10,286,453 B2  5/2019  Ruppi
(Continued)

FOREIGN PATENT DOCUMENTS

CN  102955312 A  3/2013
CN  102971849 A  3/2013
CN  106784013 A  5/2017

*Primary Examiner* — Alonzo Chambliss
(74) *Attorney, Agent, or Firm* — Duane Morris LLP (57) ABSTRACT

A semiconductor device includes a metal layer, an insulating layer disposed above the metal layer, and a multi-layer diffusion barrier disposed on the metal layer between the metal layer and the insulating layer. The multi-layer diffusion barrier includes a first material layer including a metallic nitride and a second material layer including a metallic oxide.

20 Claims, 5 Drawing Sheets

Related U.S. Application Data

(60) Provisional application No. 62/527,138, filed on Jun. 30, 2017.

(56) References Cited

U.S. PATENT DOCUMENTS

| | | |
|---|---|---|
| 10,749,004 B2 * | 8/2020 | Lin .................. H01L 21/02436 |
| 2006/0264066 A1 | 11/2006 | Bartholomew |
| 2007/0080426 A1 | 4/2007 | Matz |
| 2008/0191311 A1 | 8/2008 | Wang |
| 2010/0155953 A1 | 6/2010 | Bornstein |
| 2016/0204190 A1 | 7/2016 | Chu |

* cited by examiner

SEMICONDUCTOR DEVICE HAVING MULTI-LAYER DIFFUSION BARRIER AND METHOD OF MAKING THE SAME

CROSS-REFERENCE TO RELATED APPLICATIONS

This application is a continuation of U.S. patent application Ser. No. 16/009,925, filed Jun. 15, 2018, and entitled "MULTI-LAYER DIFFUSION BARRIER AND METHOD OF MAKING THE SAME," which claimed benefit to U.S. Provisional Appl. Ser. No. 62/527,138, filed Jun. 30, 2017, and entitled "MULTI-LAYER DIFFUSION BARRIER AND METHOD OF MAKING THE SAME," each of which is incorporated by reference herein in its entirety.

BACKGROUND

Semiconductor devices are used in a variety of electronic applications, such as personal computers, cell phones, digital cameras, and other electronic equipment, for example. Semiconductor devices are typically fabricated by sequentially depositing insulating, dielectric, conductive, and/or semiconductive layers of material over a semiconductor substrate. Patterning of the various material layers forms circuit elements and components thereon.

Conductive materials are used in semiconductor devices for making electrical connections for the integrated circuits. As semiconductor device size is reduced, diffusion between the conductive material layers and other material layers introduces undesirable signal responses in dielectric, insulating, and/or other layers.

BRIEF DESCRIPTION OF THE FIGURES

Aspects of the present disclosure are best understood from the following detailed description when read with the accompanying figures. It is noted that, in accordance with the standard practice in the industry, various features are not necessarily drawn to scale. In fact, the dimensions of the various features may be arbitrarily increased or reduced for clarity of discussion.

DETAILED DESCRIPTION

The following disclosure provides many different embodiments, or examples, for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In various embodiments, a semiconductor device including a multi-layer diffusion barrier is disclosed. The semiconductor device includes a metal layer deposited over a substrate. A multi-layer diffusion barrier is formed above the metal layer. The multi-layer diffusion barrier includes a first material layer including a metal nitride and a second material layer including a metal oxide. In some embodiments, an intermediate layer including a metal oxynitride is formed between the first material layer and the second material layer. An etch-stop layer and an insulating (or low-k) layer can be formed above the multi-layer diffusion barrier.

Figure 1:
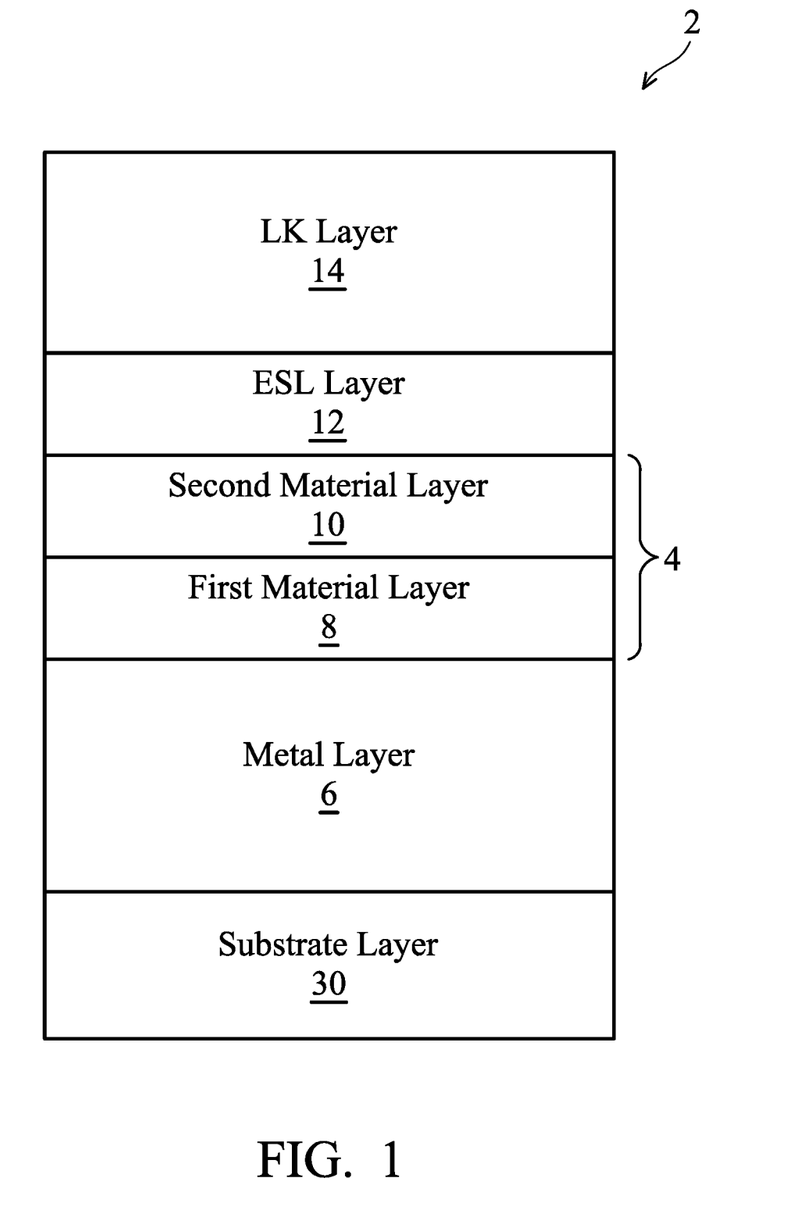
FIG. 1 illustrates a material stack including a multi-layer diffusion barrier, in accordance with some embodiments.

FIG. 1 illustrates a semiconductor device 2 including a multi-layer diffusion barrier 4, in accordance with some embodiments. The semiconductor device 2 includes a bottom metal layer 6. The metal layer 6 is deposited on a substrate 30. The substrate 30 can include any suitable material, such as glass, silicon, etc. In some embodiments, one or more additional materials (not shown) are deposited between the metal layer 6 and the substrate. A multi-layer diffusion barrier 4 is deposited above the metal layer 6. The multi-layer diffusion barrier 4 includes a first material layer 8 and a second material layer 10. The first and second material layers 8, 10 are configured to prevent diffusion of metal molecules between the metal layer 6 and one or more addition material layers, as discussed in greater detail below.

In some embodiments, the first material layer 8 can be any suitable material configured to limit diffusion of material from the metal layer 6. For example, the first material layer 8 can include a metallic nitride, such as gallium nitride (GaN), titanium nitride (TiN), tantalum nitride (TaN), aluminum nitride (AlN), and/or any other suitable metallic nitride. The first material layer 8 can be formed according to any suitable deposition process, such as chemical vapor deposition (CVD) a spin-on coating process, and/or any other suitable methods.

In some embodiments, the second material layer 10 includes a metallic oxide. The second material layer 10 can include a metallic oxide including the same metal as the metallic nitride of the first material layer 8. For example, in one embodiment, the first material layer 8 includes aluminum nitride (AlN) and the second material layer 10 includes aluminum oxide ($Al_2O_3$), although it will be appreciated that any suitable metal nitride and oxide pair can be selected, such as TiN and TiO, TaN and TaO, GaN and GaO, and/or any other suitable metal nitride and oxide set. The second material layer 10 provides an additional barrier against diffusion of material from the metal layer 6.

In some embodiments, the second material layer 10 is generated by oxidizing a portion of the first material layer 8. The first material layer 8 can be oxidized by a thermal, plasma and/or other acceptable oxidation process. For example, in embodiments in which the first material layer 8 includes aluminum nitride (AlN), a thermal/plasma oxidation process can be applied to the first material layer 8 to generate a second material layer 10 including aluminum oxide ($Al_2O_3$). In some embodiments, the second material layer 10 includes a metallic oxide with a hextragonal structure, such as, for example, $Ga_2O_3$, $Al_2O_3$, and/or any other suitable metallic oxide having a hextragonal structure.

In some embodiments, the first material layer 8 and the second material layer 10 form a dense material layer configured to limit and/or prevent diffusion from the metal layer 6 to one or more layers formed above the multi-layer diffusion barrier 4. The limitation and/or prevention of diffusion increases the conductivity of the metal layer 6. In some embodiments, a metallic oxygen nitride layer can be deposited between the first material layer 8 and the second material layer 10, as discussed in more detail with respect to FIG. 2.

In some embodiments, an etch stop layer (ESL) 12 is formed above the diffusion barrier 4. The ESL 12 can include any suitable material, such as nitrogen doped (silicon) carbide (SiC:N, also known as NDC), oxygen doped (silicon) carbide (SiC:O, also known as ODC), and/or combinations thereof. The ESL 12 can be formed by any suitable method, such as, for example, CVD. In some embodiments, the ESL 12 can be omitted, as discussed in more detail with respect to FIG. 2.

In some embodiments, a low-k (LK) layer 14 (or insulating layer) is disposed above the ESL layer 12. The LK Layer 14 includes an insulating material having a low-k dielectric constant, for example, of about 3.0 or less. The LK layer 14 can include Si, O, C, and/or any other suitable material. For example, in some embodiments, the LK layer 14 includes SiOC. The LK layer 14 can be formed by chemical vapor deposition (CVD), a spin-on coating process, and/or any other suitable methods.

The illustrated semiconductor device 2 includes a partial semiconductor material stack that can be used during semiconductor manufacture. In some embodiments, the multi-layer diffusion barrier 4 and/or the ESL layer 12 are configured to prevent diffusion of material from the metal layer 6 to one or more layers formed above the multi-layer diffusion barrier 4 and/or the ESL layer 12. For example, in the illustrated embodiment, the multi-layer diffusion barrier 4 and/or the ESL layer 12 prevent diffusion from the metal layer 6 to the low-k layer 14, although it will be appreciated that the multi-layer diffusion barrier 4 and/or the ESL layer 12 can be used with alternative material layers.

Figure 2:
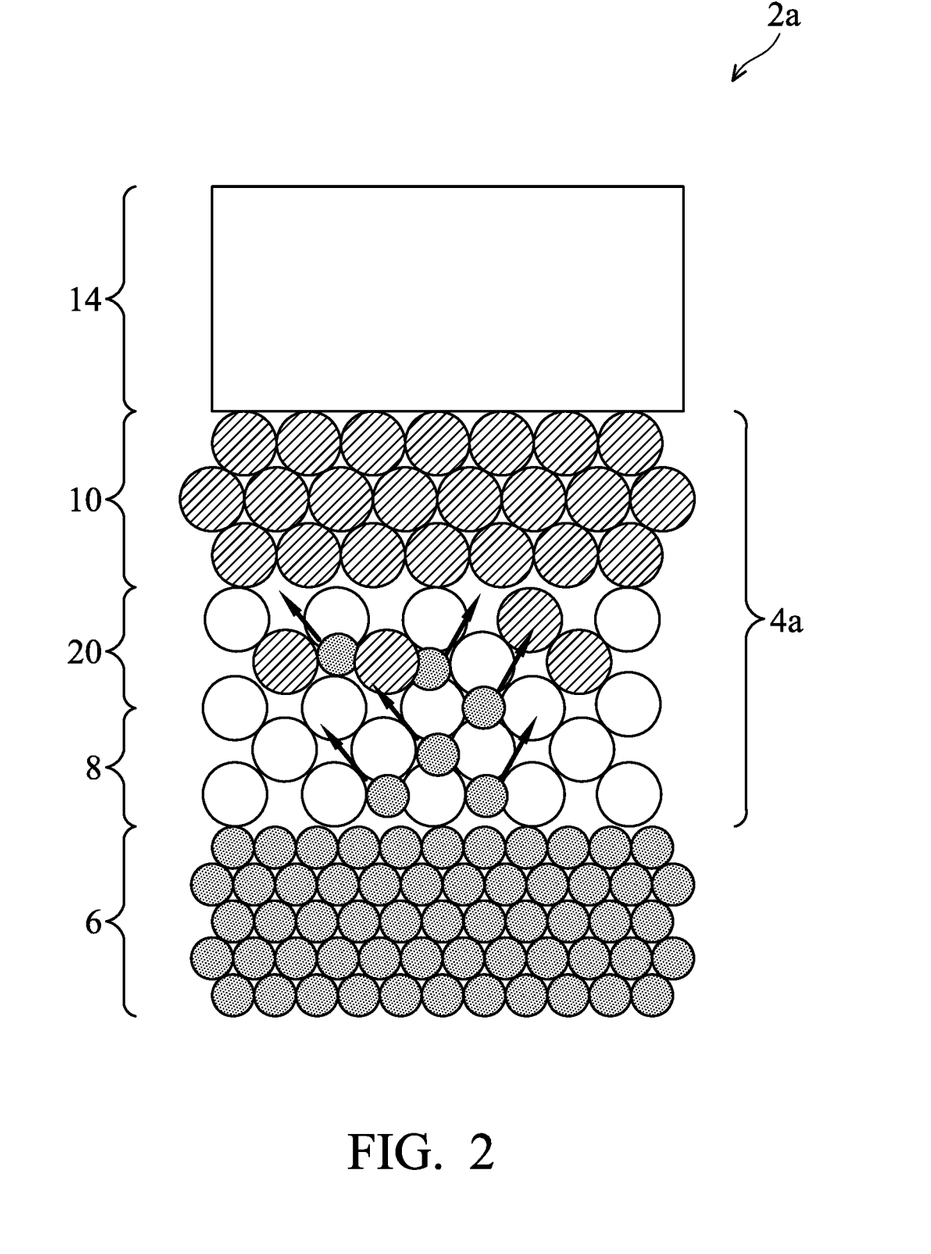
FIG. 2 illustrates a molecular view of the material stack of FIG. 1, in accordance with some embodiments.

FIG. 2 illustrates an embodiment of a semiconductor device 2a including an intermediate material layer 20 disposed between the first material layer 8 and the second material layer 10 of the multi-layer diffusion barrier 4a. The semiconductor device 2a is similar to the semiconductor device 2 discussed with respect to FIG. 1, and similar description is not repeated herein. In some embodiments, after the first material layer 8 of the multi-layer diffusion barrier 4a is formed, an intermediate material layer 20 including a metal oxynitride is formed above the first material layer 8. The intermediate material layer 20 can include a metal oxynitride including the same metal as the metallic nitride of the first material layer 8. For example, in various embodiments, the first material layer 8 and the intermediate material layer 20 can include material pairs such as AlN and $Al_xO_yN_z$, GaN and $Ga_xO_yN_z$, TiN and $Ti_xO_yN_z$, TaN and $Ta_xO_yN_z$, and/or any other suitable material pair. In some embodiments, the intermediate material layer 20 is formed simultaneously with the second material layer 10. The intermediate layer can provide additional Cu diffusion resistance. In some embodiments, the intermediate layer 20 is omitted.

In some embodiments, a second material layer 10 is formed above the intermediate material layer 20. The second material layer 10 can include a metallic oxide including the same metal as the first material layer 8 and the intermediate material layer 20. For example, in some embodiments, the first material layer 8 can include AlN, the intermediate material layer 20 can include $Al_xO_yN_z$, and the third material layer can include $Al_xO_y$, although it will be appreciated that other material combinations having other metal materials can be selected. The second material layer 10 can include a metallic oxide having a hextragonal structure, such as, for example, $Al_2O_3$.

In some embodiments, the multi-layer diffusion barrier 4, 4a can include a thickness of about 10 Å to about 50 Å. Each of the individual material layers 8, 10, 20 in the multi-layer diffusion barrier 4, 4a have a thickness of about 1 Å to 100 Å. For example, in some embodiments including a first material layer 8 and a second material layer 10, each of the material layers can include a thickness of about half the total thickness of the multi-layer diffusion barrier (e.g., a first material layer 8 and a second material layer 10 can each have a thickness of about Å A for a total thickness of the multi-layer diffusion barrier 4 of about 10 Å). As another example, in some embodiments including a first material layer 8, an intermediate material layer 20, and a second material layer 10, each of the material layers 8, 10, 20 can have a thickness of about ⅓ the total thickness of the multi-layer diffusion barrier 4a. Although specific embodiments are discussed herein, it will be appreciated that each layer in the multi-layer diffusion barrier 4, 4a can have any suitable thickness less than the total thickness of the multi-layer diffusion barrier 4, 4a.

Figure 3:
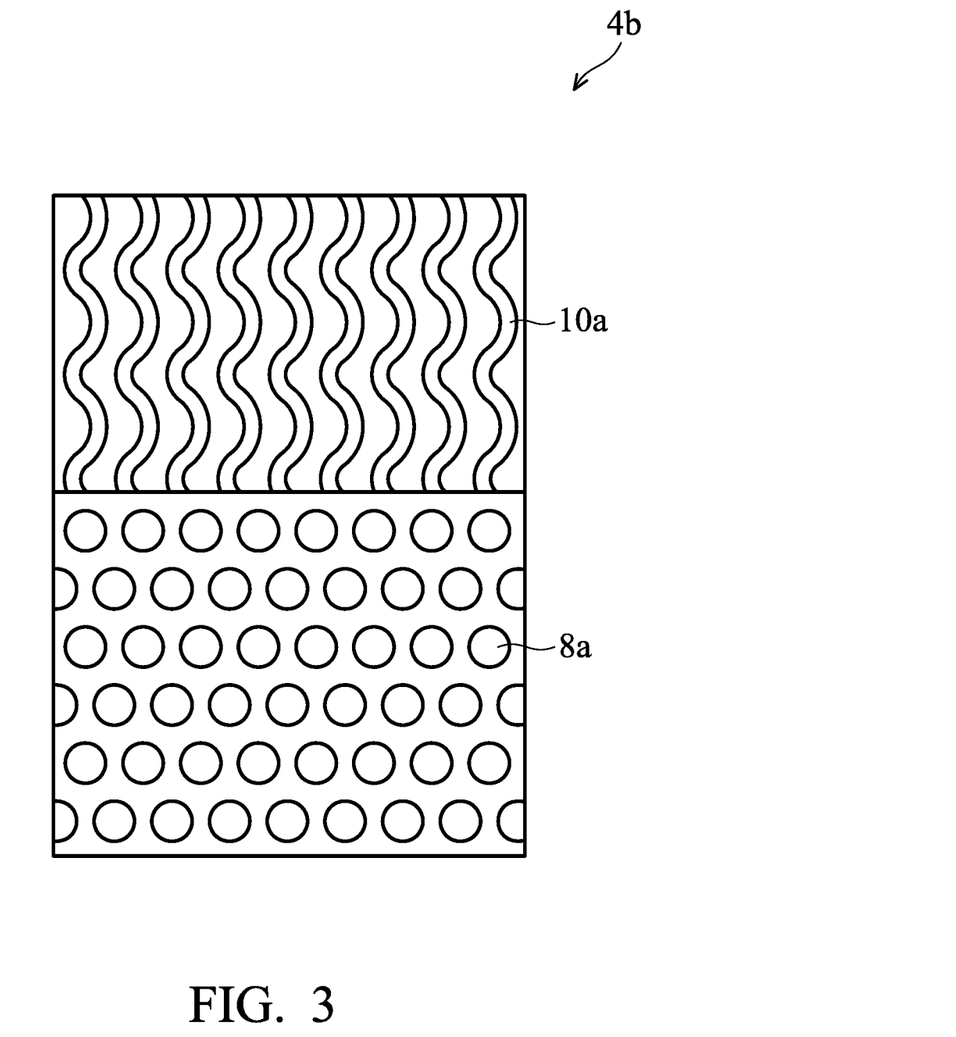
FIG. 3 illustrates a side view of multi-layer diffusion barrier, in accordance with some embodiments.

FIG. 3 illustrates a transmission electron microscope (TEM) image of a multi-layer diffusion barrier 4b including a first material layer 8a including AlN and a second material layer 10a including a material having a hextragonal structure, such as $Al_2O_3$, in accordance with some embodiments. As discussed above, the multi-layer diffusion barrier 4b prevents diffusion of a material from a metal layer 6 to one or more layers formed above the multi-layer diffusion barrier 4b. As discussed above, in some embodiments, the second material layer 10a includes a hextragonal structure 22. The illustrated embodiment includes a first material layer 8a including AlN and a second material layer 10a including $Al_2O_3$, although it will be appreciated that any suitable combination of metal nitride and a metal oxide having a hextragonal structure can be used.

Figure 4:
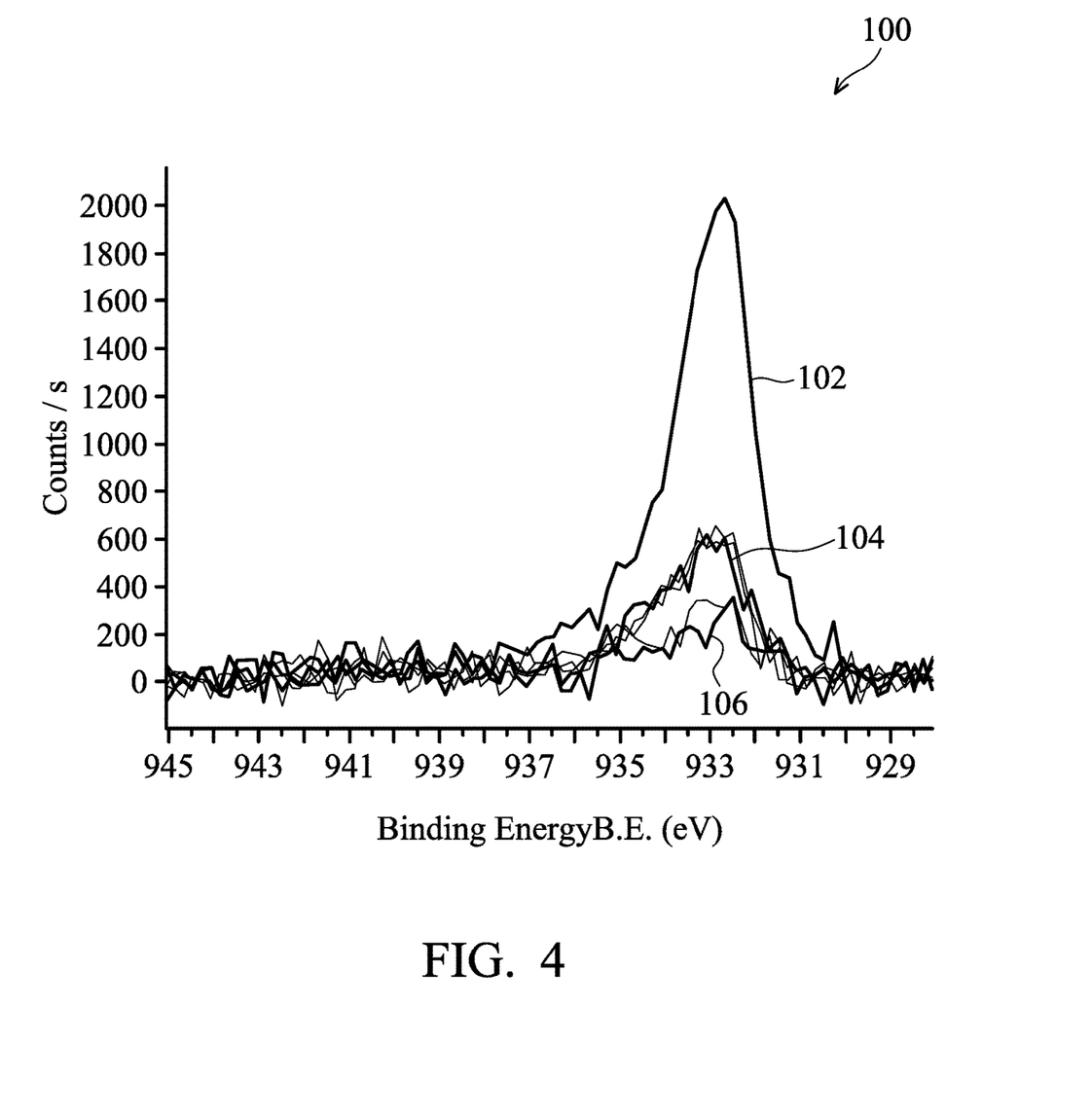
FIG. 4 is a chart illustrating various signal response for a plurality of material stacks, in accordance with some embodiments.

FIG. 4 is a chart 100 illustrating response profiles of various semiconductor devices including various diffusion barriers, in accordance with some embodiments. A first semiconductor device response 102 illustrates a signal response in an insulating layer 14 for a semiconductor device including only an ESL layer, such as the ESL layer 12 discussed above. A second semiconductor device response 104 illustrates a signal response in an insulating layer 14 for a semiconductor device including an ESL layer 12 and first material layer 8, such as a metallic nitride layer. A third device response 106 illustrates a signal response in an insulating layer 14 for a semiconductor device including an ESL 12 and a multi-layer diffusion barrier 4 including a metallic nitride layer and a metallic oxide layer, such as AlN and AlO. As shown in FIG. 5, the copper diffusions/response 106 of the device including an ESL 12 and a multi-layer diffusion barrier 4 is lower than either the device having only an ESL 12 and the device having an ESL 12 and a first material layer 8. The multi-layer diffusion barrier 4 substantially decreases diffusion of material from the metal layer 6 to the insulating layer 14 in the semiconductor device.

Figure 5:
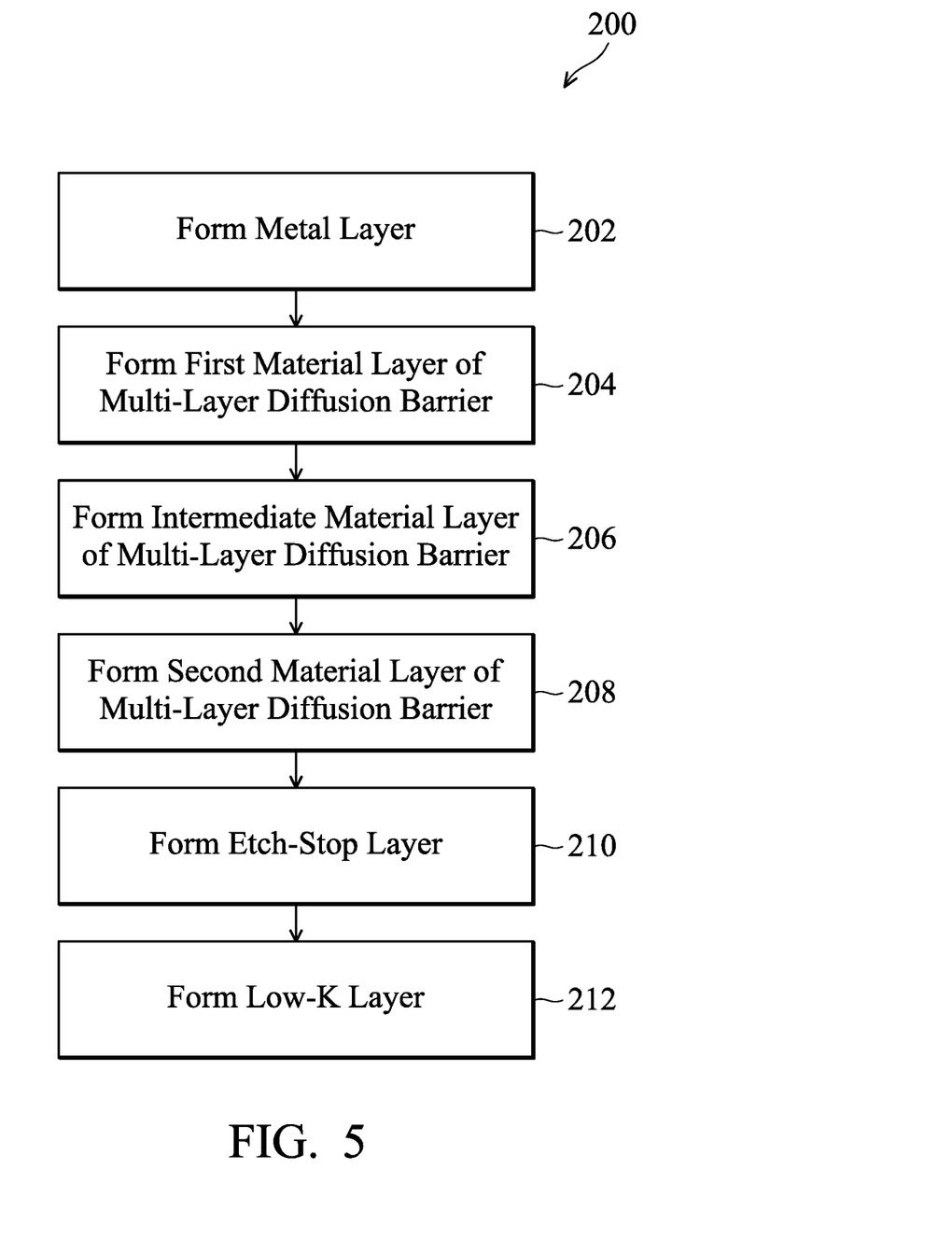
FIG. 5 illustrates a method of forming a material stack including a multi-layer diffusion barrier, in accordance with some embodiments.

FIG. 5 is a flowchart illustrating a method 200 of forming a semiconductor device, in accordance with some embodiments. At step 202, a metal layer 6 is formed above a substrate layer 30 and one or more initial layers. The metal layer 6 can include any suitable metal, such as, for example, copper and/or copper alloy. The metal layer 6 can be formed according to any suitable process, such as, for example, CVD.

At step 204, a first material layer 8 of a multi-layer diffusion barrier 4 is formed above the metal layer 6. The first material layer 8 can include a metal nitride configured to prevent diffusion of the metal material of the metal layer 6. The metal nitride can include any suitable nitride, such as GaN, TiN, AlN, TaN, and/or any other suitable metal nitride.

At optional step 206, an intermediate material layer 20 of the multi-layer diffusion barrier 4 can be formed above the first material layer 8. The intermediate material layer 20 includes a metal oxynitride. In some embodiments, the metal of the intermediate layer 20 is the same metal material as the first material layer 8. The intermediate layer 20 can be formed by oxidizing a portion of the first material layer 8 to form the metal oxynitride. In other embodiments, the intermediate layer 20 can be formed according to any suitable deposition method, such as, for example, CVD.

At step 208, a second material layer 10 of the multi-layer diffusion barrier 4 is formed above the metal layer 6 and any intermediate material layers 20. The second material layer 10 includes a metal oxide. In some embodiments, the metal of the second material layer 10 is the same metal material as at least one of the first material layer 8 and/or the intermediate material layer 20. The second material layer 10 can be formed by oxidizing a portion of the first material layer 8 and/or an intermediate material layer 20. For example, in some embodiments, the first material layer 8 includes a metal nitride. An intermediate material layer 20 including a metal oxynitride is formed by oxidizing a portion of the first material layer 8. A second material layer 10 is formed by further oxidizing the first material layer 8 and/or the intermediate material layer 20 to form a metal oxide.

At optional step 210, an etch-stop layer 12 is formed above the multi-layer diffusion barrier 4. The etch-stop layer 12 can include any suitable material, such as nitrogen doped (silicon) carbide (SiC:N, also known as NDC), oxygen doped (silicon) carbide (SiC:O, also known as ODC), and/or combinations thereof. The ESL 12 can be formed by any suitable method, such as, for example, CVD.

At step 212, a low-k material layer 14 is formed above the etch-stop layer 12 and/or the multi-layer diffusion barrier 4. The low-k material layer 14 can include Si, O, C, and/or any other suitable material. The low-k layer 14 can be formed by chemical vapor deposition (CVD), a spin-on coating process, and/or any other suitable methods.

In various embodiments, a semiconductor device is disclosed. The semiconductor device includes a metal layer, an insulating layer disposed above the metal layer, and a multi-layer diffusion barrier disposed on the metal layer between the metal layer and the insulating layer. The multi-layer diffusion barrier includes a first material layer including a metallic nitride and a second material layer including a metallic oxide.

In various embodiments, a semiconductor device is disclosed. The semiconductor device includes a metal layer, a multi-layer diffusion barrier disposed on the metal layer, an etch-stop layer disposed on the multi-layer diffusion barrier, and a low-k layer disposed on the etch-stop layer. The multi-layer diffusion barrier includes a first material layer including a metallic nitride, an intermediate material layer including a metal oxynitride, and a second material layer including a metallic oxide.

In various embodiments, a method of forming a semiconductor device is disclosed. The method includes depositing a conductive metal layer and forming a diffusion barrier on the conductive metal layer. The diffusion barrier includes a metallic nitride layer deposited on the conductive metal layer and a metallic oxide layer above the metallic nitride layer. An insulating layer is deposited above the diffusion barrier.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a multi-layer diffusion barrier comprising:
      a first material layer including a metallic nitride;
      a second material layer including a metallic oxide; and
      at least one intermediate layer disposed between the first material layer and the second material layer, wherein the at least one intermediate layer includes a metal oxynitride.

2. The semiconductor device of claim 1, wherein the metallic nitride of the first material layer the metallic oxide of the second material layer each include a same metal.

3. The semiconductor device of claim 2, wherein the metallic oxide of the second material layer is formed by oxidizing the metallic nitride of the first material layer.

4. The semiconductor device of claim 1, wherein a metal in each of the metallic nitride, the metal oxynitride, and the metallic oxide include a same metal.

5. The semiconductor device of claim 1, wherein the metallic nitride comprises one of gallium nitride, aluminum nitride, titanium nitride, or tantalum nitride and the metallic oxide comprises one of gallium oxide, aluminum oxide, titanium oxide, or tantalum oxide.

6. The semiconductor device of claim 1, wherein the metallic oxide of the second material layer has a hexagonal structure.

7. The semiconductor device of claim 1, wherein the multi-layer diffusion barrier has a thickness of about 10 Å to about 50 Å.

8. The semiconductor device of claim 1, comprising an etch-stop layer disposed between the multi-layer diffusion barrier and the insulating layer.

9. The semiconductor device of claim 8, wherein the etch-stop layer comprises a nitrogen doped (silicon) carbide, and oxygen doped (silicon) carbide, or a combination thereof.

10. A semiconductor device, comprising
    a multi-layer diffusion barrier disposed on a metal layer, the multi-layer diffusion barrier comprising:
       a first material layer including a metallic nitride;
       an intermediate material layer including a metal oxynitride; and
       a second material layer including a metallic oxide, wherein the intermediate layer is disposed between the first material layer and the second material layer; and
    an etch-stop layer disposed on the multi-layer diffusion barrier; and a low-k layer disposed on the etch-stop layer, wherein the low-k layer comprises silicon (Si).

11. The semiconductor device of claim 10, wherein a metal in each of the metallic nitride, the metal oxynitride, and the metallic oxide include a same metal.

12. The semiconductor device of claim 10, wherein the intermediate material layer is formed by oxidizing a portion of the first material layer and the second material layer is formed by oxidizing a portion of the intermediate material layer.

13. The semiconductor device of claim 10, wherein the metallic nitride comprises one of gallium nitride, aluminum nitride, titanium nitride, or tantalum nitride, the metal oxynitride comprises one of gallium oxygen nitride, aluminum oxygen nitride, titanium oxygen nitride, or tantalum oxygen nitride and the metallic oxide comprises one of gallium oxide, aluminum oxide, titanium oxide, or tantalum oxide.

14. The semiconductor device of claim 10, wherein the metallic oxide of the second material layer has a hexagonal structure.

15. The semiconductor device of claim 10, wherein the multi-layer diffusion barrier comprises a thickness substantially between 10 Å and 50 Å.

16. The semiconductor device of claim 11, wherein the etch-stop layer comprises a nitrogen doped (silicon) carbide, and oxygen doped (silicon) carbide, or a combination thereof.

17. A method of forming a semiconductor device, comprising:
   depositing a conductive metal layer;
   forming a diffusion barrier on the conductive metal layer, the diffusion barrier comprising a metallic nitride layer deposited on the conductive metal layer, a metal oxynitride layer above the metallic nitride layer, and a metallic oxide layer above the metallic oxynitride layer; and
   forming an etch-stop layer on the diffusion barrier.

18. The method of claim 17, wherein forming the metallic oxynitride layer comprises oxidizing a portion of the metallic nitride layer.

19. The method of claim 17, wherein forming the metallic oxide layer comprises oxidizing a portion of the metallic oxynitride layer.

20. The method of claim 17, wherein the multi-layer diffusion barrier comprises a thickness substantially between 10 Å and 50 Å.

* * * * *